United States Patent
Tadano

(10) Patent No.: US 12,373,744 B2
(45) Date of Patent: Jul. 29, 2025

(54) CONVEYANCE ROUTE DESIGN DEVICE, CONVEYANCE ROUTE DESIGN METHOD, AND A RECORDING MEDIUM

(71) Applicant: NEC Corporation, Tokyo (JP)

(72) Inventor: Kumiko Tadano, Tokyo (JP)

(73) Assignee: NEC CORPORATION, Tokyo (JP)

(*) Notice: Subject to any disclaimer, the term of this patent is extended or adjusted under 35 U.S.C. 154(b) by 1009 days.

(21) Appl. No.: 17/433,675

(22) PCT Filed: Feb. 28, 2019

(86) PCT No.: PCT/JP2019/007844
§ 371 (c)(1),
(2) Date: Aug. 25, 2021

(87) PCT Pub. No.: WO2020/174662
PCT Pub. Date: Sep. 3, 2020

(65) Prior Publication Data
US 2022/0043944 A1 Feb. 10, 2022

(51) Int. Cl.
*G06Q 10/047* (2023.01)
*B65G 1/00* (2006.01)

(52) U.S. Cl.
CPC .......... *G06Q 10/047* (2013.01); *B65G 1/00* (2013.01)

(58) Field of Classification Search
None
See application file for complete search history.

(56) References Cited

U.S. PATENT DOCUMENTS

| | | | |
|---|---|---|---|
| 11,356,360 B2* | 6/2022 | Nishikawa | G06Q 10/10 |
| 2005/0158152 A1* | 7/2005 | Otaguro | H01L 21/67727 414/217 |
| 2006/0136085 A1* | 6/2006 | Steinhilper | G05B 19/41865 29/430 |
| 2012/0065762 A1* | 3/2012 | Pillarisetti | G06Q 99/00 705/500 |
| 2013/0026002 A1* | 1/2013 | Spangler | B65G 35/066 198/339.1 |

(Continued)

FOREIGN PATENT DOCUMENTS

| | | |
|---|---|---|
| DE | 102010044239 A1 | 10/2011 |
| JP | 2000-039905 A | 2/2000 |

(Continued)

OTHER PUBLICATIONS

JP Office Action for JP Application No. 2021-501498, mailed on Jul. 26, 2022 with English Translation.

(Continued)

*Primary Examiner* — Jamie H Austin
(74) *Attorney, Agent, or Firm* — Sughrue Mion, PLLC

(57) ABSTRACT

A conveyance route design device improves object conveyance efficiency. The conveyance route design device determines an improvement target place that satisfies criteria for improving an actual conveyance amount with respect to a conveyance request amount, for a plurality of conveyance routes, and determines a conveyance device to be assigned to an intersecting position where the conveyance routes intersect, based on whether or not the conveyance route including the improvement target place intersects.

13 Claims, 12 Drawing Sheets

(56) References Cited

U.S. PATENT DOCUMENTS

| | | | |
|---|---|---|---|
| 2014/0018955 A1* | 1/2014 | Asakawa | G05B 19/41865 700/230 |
| 2015/0151913 A1* | 6/2015 | Wong | B65G 1/1373 700/214 |
| 2017/0246883 A1* | 8/2017 | Yoshida | B41J 2/15 |
| 2018/0079601 A1* | 3/2018 | Khong | B62B 3/005 |
| 2018/0148271 A1* | 5/2018 | Svenningsen | B65G 21/2072 |
| 2018/0286140 A1* | 10/2018 | Nishimura | G07C 1/02 |
| 2019/0137979 A1* | 5/2019 | Akella | G06V 20/52 |
| 2019/0196452 A1* | 6/2019 | Koga | G05B 19/4093 |
| 2019/0310655 A1* | 10/2019 | Voorhies | G05D 1/0287 |
| 2020/0130510 A1* | 4/2020 | Eck | B60L 53/14 |
| 2020/0130945 A1* | 4/2020 | Deuser | B65G 35/06 |
| 2020/0143127 A1* | 5/2020 | Wagner | B65G 47/91 |
| 2020/0160240 A1* | 5/2020 | Tadano | G06Q 50/04 |
| 2020/0216130 A1* | 7/2020 | Von Krauland | B62D 65/18 |
| 2022/0017306 A1* | 1/2022 | Fourney | B65G 47/54 |
| 2022/0043944 A1* | 2/2022 | Tadano | G06F 30/13 |
| 2022/0155789 A1* | 5/2022 | Tadano | G06Q 10/06315 |

FOREIGN PATENT DOCUMENTS

| | | | | |
|---|---|---|---|---|
| JP | 2004-355147 A | 12/2004 | | |
| JP | 2006-031360 A | 2/2006 | | |
| JP | 2009-166978 A | 7/2009 | | |
| JP | 2013-127734 A | 6/2013 | | |
| WO | WO-2007014834 A1 * | 2/2007 | | G06Q 10/04 |
| WO | 2014/012861 A1 | 1/2014 | | |
| WO | 2018/193585 A1 | 10/2018 | | |

OTHER PUBLICATIONS

International Search Report for PCT Application No. PCT/JP2019/007844, mailed on Jun. 4, 2019.

* cited by examiner

LAYOUT INFORMATION

| OBSTACLE ID | VERTEX COORDINATES OF OBSTACLE SHAPE |
|---|---|
| O1 | {(1,1), (2,1), (2,2), (1,2) } |
| O2 | {(4,4), (12,4), (12,12), (4,12)} |
| O3 | {(15,15), (18,15), (18,18), (15,18) } |
| O4 | {(26,0), (30,0), (30,4), (28,6), (26, 4)} |
| O5 | {(20,0), (24,0), (24,4), (20,4) } |
| O6 | {(20,20), (24,20), (24,24), (20,24) } |
| O7 | {(0,16), (1,16), (1,18), (0,18) } |
| O8 | {(8,23), (10,23), (10,24), (8,24) } |
| O9 | {(11,23), (13,23), (13,24), (11,24) } |
| O10 | {(14,23), (16,23), (16,24), (14,24) } |

CONVEYANCE ROUTE INFORMATION

| CONVEYANCE ROUTE ID | CONVEYANCE SOURCE | CONVEYANCE DESTINATION | PASSING POINT | SHAPE |
|---|---|---|---|---|
| R1 | (5,4) | (5,0) | none | STRAIGHT LINE |
| R2 | (8,4) | (8,0) | none | STRAIGHT LINE |
| R3 | (11,4) | (11,0) | none | STRAIGHT LINE |
| R4 | (17,0) | (19,24) | (17,12),(19,12) | TURNING LINE |
| R5 | (21,4) | (21,20) | none | STRAIGHT LINE |
| R6 | (23,4) | (23,20) | none | STRAIGHT LINE |
| R7 | (1,17) | (15,23) | none | CURVE |
| R8 | (1,17) | (12,23) | none | CURVE |
| R9 | (1,17) | (9,23) | none | CURVE |
| R10 | (0,14) | (31,8) | (14,14),(14,8) | TURNING LINE |
| R11 | (0,11) | (4,11) | none | STRAIGHT LINE |
| R12 | (0,8) | (4,8) | none | STRAIGHT LINE |
| R13 | (0,5) | (4,8) | none | STRAIGHT LINE |

FIG. 8A

CONVEYANCE REQUEST HISTORY INFORMATION

| CONVEYANCE REQUEST ID | CONVEYANCE SOURCE | CONVEYANCE DESTINATION | TIME OF REQUEST | OBJECT ID | DEADLINE | CONVEYANCE DEVICE ID |
|---|---|---|---|---|---|---|
| Req1 | (17,0) | (20,24) | 10:32:54 | P1 | 10:45 | E1 |
| Req2 | (21,4) | (21,20) | 10:33:05 | P2 | 10:45 | E2 |
| Req3 | (0,14) | (31,8) | 10:33:21 | P3 | 10:50 | E1 |
| ⋮ | ⋮ | ⋮ | ⋮ | ⋮ | ⋮ | ⋮ |

FIG. 8B

MOVEMENT HISTORY INFORMATION

| MOVEMENT HISTORY ID | CURRENT COORDINATES | CONVEYANCE ROUTE ID DURING STAY | TIME | CONVEYANCE REQUEST ID | CONVEYANCE DEVICE ID |
|---|---|---|---|---|---|
| M1 | (17,0) | R4 | 10:34:54 | Req1 | E1 |
| M2 | (21,6) | R5 | 10:35:05 | Req2 | E2 |
| M3 | (29,8) | R10 | 10:35:20 | Req3 | E1 |
| ⋮ | ⋮ | ⋮ | ⋮ | ⋮ | ⋮ |

FIG. 8C

IMPROVEMENT CANDIDATE ROUTE INFORMATION

| IMPROVEMENT CANDIDATE ROUTE ID | START POINT | END POINT | CONVEYANCE ROUTE | IMPROVEMENT NECESSITY DEGREE |
|---|---|---|---|---|
| C1 | (17,0) | (17,12) | R4 | 100 |
| C2 | (21,4) | (21,20) | R5 | 50 |
| C3 | (14,8) | (31,8) | R10 | 100 |
| C4 | (5,4) | (5,0) | R1 | 75 |

FIG. 12

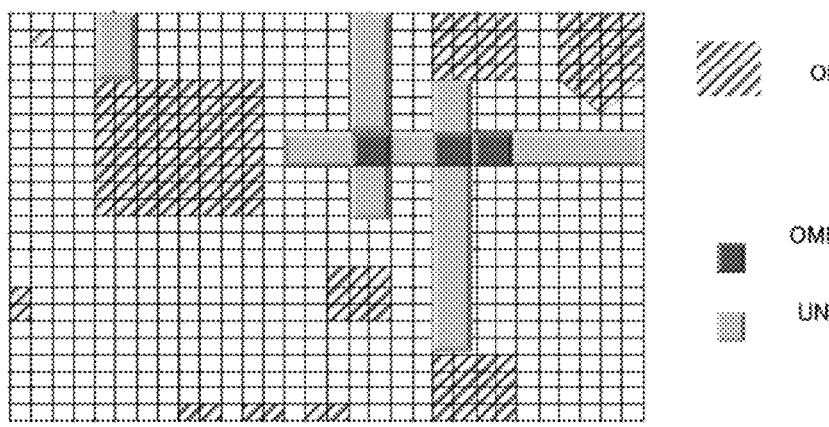

FIG. 13

DEVICE ASSIGNMENT INFORMATION

| ASSIGNMENT ID | IMPROVEMENT CANDIDATE ROUTE ID | START POINT | END POINT | TYPE OF CONVEYOR |
|---|---|---|---|---|
| A1 | C1 | (17,0) | (17,7) | UNIDIRECTIONAL CONVEYOR |
| A2 | C1 | (17,7) | (17,9) | OMNIDIRECTIONAL CONVEYOR |
| A3 | C1 | (17,9) | (17,12) | UNIDIRECTIONAL CONVEYOR |
| A4 | C2 | (21,4) | (21,7) | UNIDIRECTIONAL CONVEYOR |
| A5 | C2 | (21,7) | (21,9) | OMNIDIRECTIONAL CONVEYOR |
| A6 | C2 | (21,9) | (21,20) | UNIDIRECTIONAL CONVEYOR |
| A7 | C3 | (14,8) | (17,8) | UNIDIRECTIONAL CONVEYOR |
| A8 | C3 | (17,8) | (19,8) | OMNIDIRECTIONAL CONVEYOR |
| A9 | C3 | (19,8) | (22,8) | UNIDIRECTIONAL CONVEYOR |
| A10 | C3 | (22,8) | (24,8) | OMNIDIRECTIONAL CONVEYOR |
| A11 | C3 | (24,8) | (26,8) | OMNIDIRECTIONAL CONVEYOR |
| A12 | C3 | (26,8) | (31,8) | UNIDIRECTIONAL CONVEYOR |
| A13 | C4 | (5,4) | (5,0) | UNIDIRECTIONAL CONVEYOR |

DEVICE ASSIGNMENT INFORMATION

| ASSIGNMENT ID | START POINT | END POINT | TYPE OF CONVEYOR |
|---|---|---|---|
| A1 | (17,0) | (17,12) | OMNIDIRECTIONAL CONVEYOR |
| A2 | (21,4) | (26,20) | OMNIDIRECTIONAL CONVEYOR |
| A3 | (14,8) | (31,8) | OMNIDIRECTIONAL CONVEYOR |
| A4 | (5,4) | (5,0) | UNIDIRECTIONAL CONVEYOR |

FIG. 16

IMPROVEMENT PLAN INFORMATION

| IMPROVEMENT PLAN ID | C1 | C2 | C3 | C4 |
|---|---|---|---|---|
| I1 (PRESENT) | IMPROVED | NOT IMPROVED | NOT IMPROVED | NOT IMPROVED |
| I2 | IMPROVED | NOT IMPROVED | NOT IMPROVED | NOT IMPROVED |
| I3 | NOT IMPROVED | IMPROVED | NOT IMPROVED | NOT IMPROVED |
| I4 | NOT IMPROVED | NOT IMPROVED | IMPROVED | NOT IMPROVED |
| I5 | NOT IMPROVED | NOT IMPROVED | NOT IMPROVED | IMPROVED |
| I6 | IMPROVED | IMPROVED | NOT IMPROVED | NOT IMPROVED |
| I7 | IMPROVED | NOT IMPROVED | IMPROVED | NOT IMPROVED |
| I8 | IMPROVED | NOT IMPROVED | NOT IMPROVED | IMPROVED |
| I9 | NOT IMPROVED | IMPROVED | IMPROVED | NOT IMPROVED |
| I10 | NOT IMPROVED | IMPROVED | NOT IMPROVED | IMPROVED |
| I11 | NOT IMPROVED | NOT IMPROVED | IMPROVED | IMPROVED |
| I12 | IMPROVED | IMPROVED | IMPROVED | NOT IMPROVED |
| I13 | IMPROVED | IMPROVED | NOT IMPROVED | IMPROVED |
| I14 | IMPROVED | NOT IMPROVED | IMPROVED | IMPROVED |
| I15 | NOT IMPROVED | IMPROVED | IMPROVED | IMPROVED |
| I16 | IMPROVED | IMPROVED | IMPROVED | IMPROVED |

FIG. 17

CONVEYANCE DEVICE INFORMATION

| CONVEYANCE DEVICE ID | DESCRIPTION | AVERAGE CONVEYANCE EFFICIENCY [/S] | REPLACEMENT COST [/M] |
|---|---|---|---|
| E1 | OMNIDIRECTIONAL CONVEYOR | 10 | 1000 |
| E2 | UNIDIRECTIONAL CONVEYOR | 10 | 200 |
| E3 | CONVEYANCE VEHICLE | 1 | 0 |

FIG. 18

EVALUATION RESULT INFORMATION

| IMPROVEMENT PLAN ID | REQUIRED COST | EVALUATION INDEX | |
|---|---|---|---|
| I1 | 200*0+1000*0=0 | 100 | |
| I2 | 200*(7+3)+1000*2=4000 | 200 | |
| I3 | 200*(3+11)+1000*2=4800 | 200 | |
| I4 | 200*(3+3+5)+1000*(2+2+2)=8200 | 200 | |
| I5 | 200*4+1000*0=800 | 200 | P1 |
| I6 | I2+I3-1000*2=6800 | 400 | |
| I7 | I2+I4-1000*2=10200 | 400 | |
| I8 | I2+I5=4800 | 400 | P2 |
| I9 | I3+I4-1000*2=11000 | 400 | |
| I10 | I3+I5=5600 | 400 | |
| I11 | I4+I5=9000 | 400 | |
| I12 | I2+I3+I4-1000*4=13000 | 600 | |
| I13 | I2+I3+I5-1000*2=7600 | 600 | |
| I14 | I2+I4+I5-1000*2=9000 | 600 | P3 |
| I15 | I3+I4+I5-1000*2=11800 | 600 | |
| I16 | I2+I3+I4+I5-1000*4=17800 | 1000 | |

FIG. 19

ALLOWABLE COST INFORMATION

| IMPROVEMENT DESIGN PLAN | REQUIRED COST |
|---|---|
| P1 | 1000 |
| P2 | 5000 |
| P3 | 10000 |

CONVEYANCE ROUTE DESIGN DEVICE, CONVEYANCE ROUTE DESIGN METHOD, AND A RECORDING MEDIUM

This application is a National Stage Entry of PCT/JP2019/007844 filed on Feb. 28, 2019, the contents of all of which are incorporated herein by reference, in their entirety.

TECHNICAL FIELD

The present invention relates to a device or the like for improving conveyance efficiency of conveyance routes.

BACKGROUND ART

In factories and warehouses, in order to improve the conveyance efficiency of objects (electronic parts, chemicals, work-in-process products, pallets, etc.), design changes of conveyance routes and conveyance means are often made based on the movement history of the objects carried by conveyance vehicles (AGVs, forklifts, bogies). Also, due to the serious labor shortage, it is becoming difficult to secure workers who supply parts and materials required in each process and designers who are skilled in the layout of factories and warehouses. For example, Patent Document 1 discloses a method of determining the optimum conveyance route based on the conveyance cost and the movement cost of the objects.

In order to improve the conveyance efficiency, it is conceivable to install a unidirectional conveyor in the conveyance route in which objects are frequently conveyed, in order to speed up the conveyance of the objects in a specific direction. However, if the conveyance route in which the objects are frequently conveyed is simply changed to the unidirectional conveyor, there occurs such a problem that the conveyance vehicles cannot move on the conveyance route intersecting the conveyor. On the other hand, in recent years, omnidirectional conveyors (e.g., celluveyor) different from the unidirectional conveyors are spreading. The omnidirectional conveyor can convey the objects in any direction on the conveying surface. Patent Document 2 discloses an omnidirectional conveyor of a modular type.

PRECEDING TECHNICAL REFERENCES

Patent Documents

Patent Document 1: International Publication No. WO2018/193585
Patent Document 2: International Publication No. WO2014/012861

SUMMARY OF INVENTION

Problem to be Solved by the Invention

The above patent documents do not describe a method for improving conveyance efficiency by effectively combining different conveyance devices such as conveyance vehicles, unidirectional conveyors and omnidirectional conveyors.

It is an example object of the present invention to provide a conveyance route design technique capable of improving conveyance efficiency of objects in a conveyance system.

Means for Solving the Problem

In order to solve the above example object, according to an example aspect of the present invention, there is provided a conveyance route design device comprising:

a determination unit configured to determine an improvement target place that satisfies criteria for improving an actual conveyance amount with respect to a conveyance request amount, for a plurality of conveyance routes; and an assignment unit configured to determine a conveyance device to be assigned to an intersecting position where the conveyance routes intersect, based on whether or not the conveyance route including the improvement target place intersects.

According to another example aspect of the present invention, there is provided a conveyance route design method executed by a computer, the method comprising:

determining an improvement target place that satisfies criteria for improving an actual conveyance amount with respect to a conveyance request amount, for a plurality of conveyance routes; and determining a conveyance device to be assigned to an intersecting position where the conveyance routes intersect, based on whether or not the conveyance route including the improvement target place intersects.

According to still another example aspect of the present invention, there is provided a recording medium recording a conveyance route design program that causes a computer to function as:

a determination unit configured to determine an improvement target place that satisfies a criterion for improving an actual conveyance amount with respect to a conveyance request amount, for a plurality of conveyance routes; and an assignment unit configured to determine a conveyance device to be assigned to an intersecting position where the conveyance routes intersect, based on whether or not the conveyance route including the improvement target place intersects.

Effect of the Invention

According to the present invention, it is possible to improve conveyance efficiency of objects in a conveyance system.

BRIEF DESCRIPTION OF THE DRAWINGS

FIGS. 8A to 8C illustrate examples of conveyance request history information, movement history information and improvement candidate route information.

FIG. 12 is a plan view illustrating an assignment example of the conveyance devices to the improvement candidate routes.

FIG. 13 illustrates device assignment information corresponding to the assignment example shown in FIG. 12.

FIG. 16 illustrates an example of improvement plan information.

FIG. 17 illustrates an example of conveyance device information.

FIG. 18 illustrates an example of evaluation result information.

FIG. 19 illustrates an example of allowable cost information.

EXAMPLE EMBODIMENTS

Preferred example embodiments of the present invention will now be described below with reference to the attached drawings.

[Device Configuration]

Figure 1:
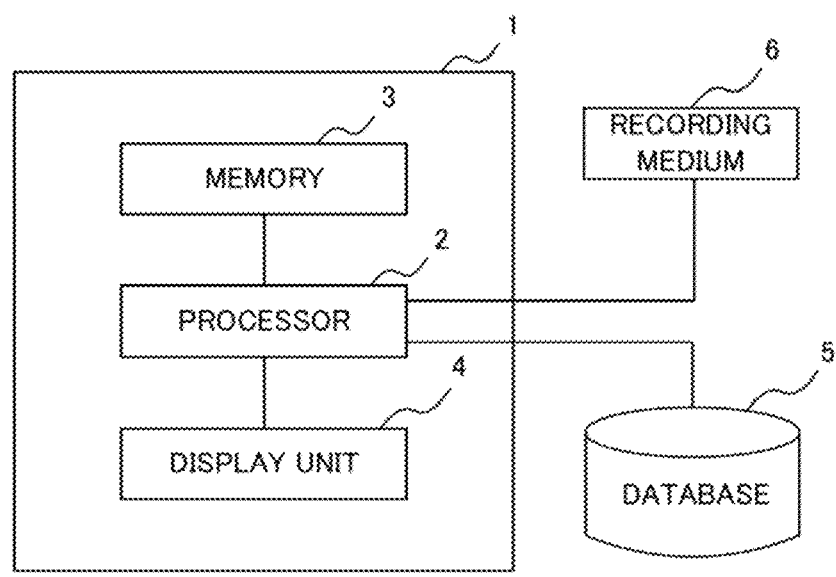
FIG. 1 is a block diagram illustrating a hardware configuration of a conveyance route design device according to example embodiments.

FIG. 1 is a block diagram illustrating a hardware configuration of a conveyance route design device according to the example embodiments. The conveyance route design device 1 is constituted by a computer, and includes a processor 2, a memory 3 and a display unit 4. The conveyance route design device 1 is connected to a database 5 and a recording medium 6. As will be described later, the database 5 stores various kinds of information necessary for designing the conveyance routes. The recording medium 6 records a program for designing the conveyance routes. The recording medium 6 is, for example, a non-transitory recording medium such as a non-volatile recording medium. When the conveyance route design device 1 executes processing, the program recorded on the recording medium 6 is loaded into the memory 3. Also, the memory 3 functions as a work memory during execution of the conveyance route improvement processing by the conveyance route design device 1, and stores various kinds of information generated during the processing. The display unit 4 displays improvement plans of the conveyance routes obtained by the conveyance route improvement processing to be presented to the user.

[Conveyance Device]

The conveyance route design device 1 is installed in a factory or a warehouse, and designs the conveyance routes of high conveyance efficiency for a conveyance system utilizing a plurality of different conveyance devices. Here, the conveyance device may be a conveyance vehicle, a unidirectional conveyor and an omnidirectional conveyor. The conveyance efficiency is indicated by, for example, a number of objects conveyed per unit time, a ratio of a number of shipped objects to a number of incoming objects, a ratio to a number of conveyed objects in other conveyance routes, etc. First, the characteristics of each conveyance device will be described.

The characteristics of the conveyance vehicles are as follows:

The conveyance efficiency of the conveyance vehicle is lower than that of the conveyor, and the number that can be conveyed at a time is limited. The conveyance vehicles may need to decelerate or stop to avoid other conveyance vehicles sharing the conveyance route or passengers. When the travel routes overlap, congestion due to concentration of the conveyance vehicles and conveyance delay due to the exclusive control at intersections may occur frequently. In the exclusive control at intersections, the conveyance vehicle generally requires "deceleration→stopping→acceleration" and wastes energy. At the same time, the conveyance vehicle requires time to pass through intersections, causing traffic jams frequently.

Regarding the conveyance vehicles, flexibility of the conveyance routes is high. Since the conveyance vehicle itself can move in various directions, it can convey objects to any place where it can travel.

The occupied area of the conveyance vehicle is only the area where the conveyance vehicle exists at that time. Since the conveyance device is normally moving, there is no area where the conveyance vehicle always occupies.

The characteristics of the unidirectional conveyor are as follows.

The conveyance efficiency of the unidirectional conveyor is generally higher than that of the conveyance vehicle.

Regarding the unidirectional conveyor, the flexibility of the conveyance route is lower than that of the conveyance vehicle. The unidirectional conveyor is capable of conveying objects on a predetermined conveyance route, in many cases, only in a predetermined direction. Incidentally, although the conveyance route of the unidirectional conveyor may include branching in a specific direction, since the objects collide with the branching instrument at high speed, it is only available to the conveyance of impact-resistant objects (e.g., objects packed in cardboard, etc.). On the other hand, if the conveyance is made slow in order to reduce the impact, the conveyance capacity will be lowered. Incidentally, since the example embodiments are intended for various types of objects including an impact-non-resistant material such as electronic substrates, it is supposed that the conveyance route by the unidirectional conveyor have no branching. However, the present invention is not necessarily limited to the handling of objects that are not impact-resistant.

As to the occupied area, the unidirectional conveyor fully occupies the installed area. The conveyance vehicles or the objects cannot move across the area occupied by the unidirectional conveyor.

The new installation cost of the unidirectional conveyor is cheaper than that of the omnidirectional conveyor.

The characteristics of the omnidirectional conveyor are as follows.

The conveyance efficiency of the omnidirectional conveyor is generally higher than that of the conveyance vehicle.

Regarding the omnidirectional conveyor, the flexibility of the conveyance route is lower than that of the conveyance vehicle, but is higher than that of the unidirectional conveyor. The omnidirectional conveyor can change the conveyance direction quickly and flexibly.

As to the occupied area, the omnidirectional conveyor occupies the installed area. The conveyance vehicle cannot move across the place where the omnidirectional conveyor is installed. On the other hand, if the object is moved by placing it on the omnidirectional conveyor, the object itself can move in various directions with respect to the omnidirectional conveyor.

The new installation cost of the omnidirectional conveyor is higher than that of the unidirectional conveyor.

First Example Embodiment

Next, a first example embodiment of the present invention will be described.

(Functional Configuration)

Figure 2:
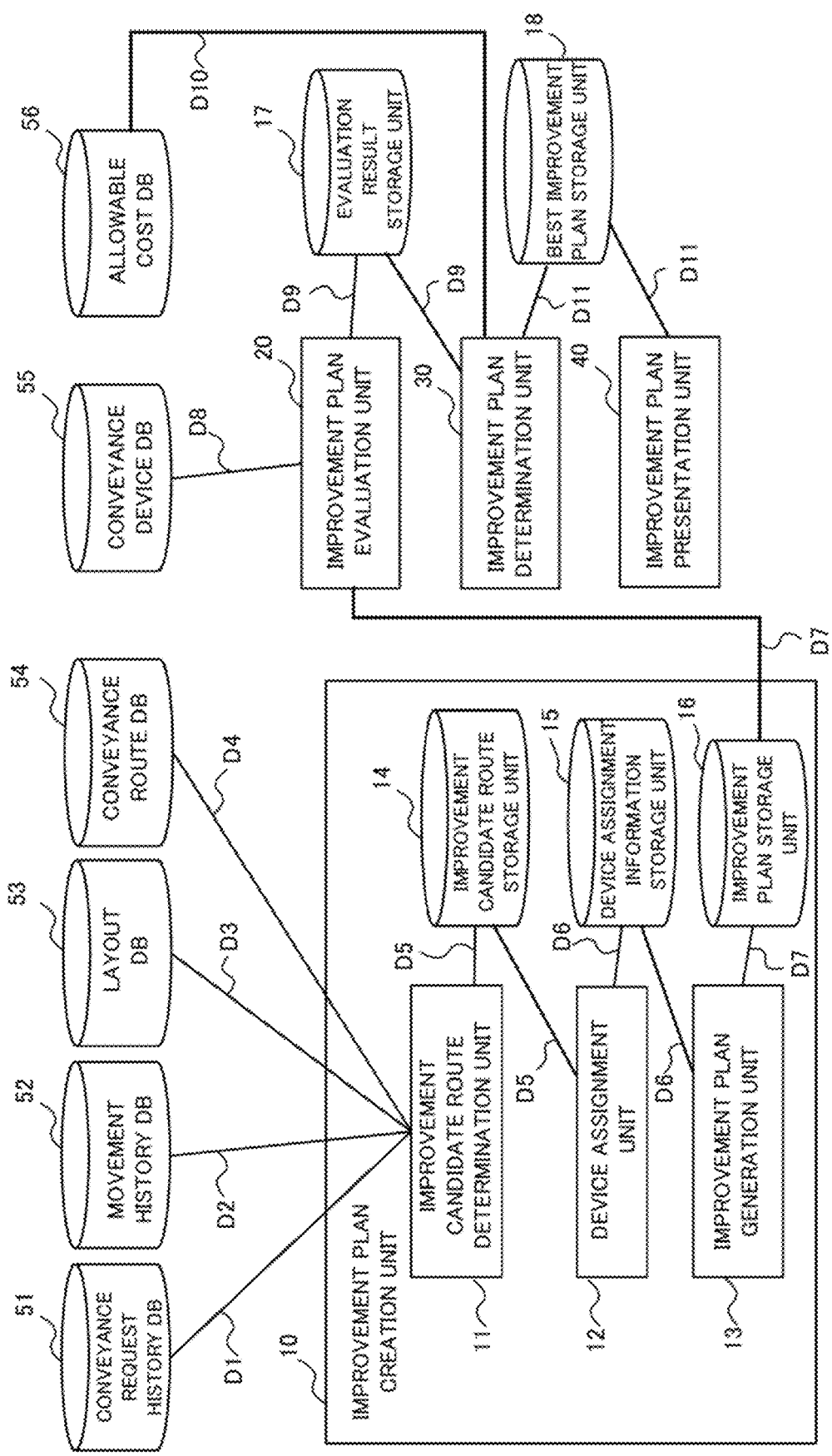
FIG. 2 is a block diagram illustrating a functional configuration of the conveyance route design device according to a first example embodiment.

FIG. 2 illustrates a functional configuration of the conveyance route design device according to the first example embodiment. The conveyance route design device according to this example embodiment roughly includes an improvement plan creation unit 10, an improvement plan evaluation unit 20, an improvement plan determination unit 30, an improvement plan presentation unit 40, an evaluation result storage unit 17, and a best improvement plan storage unit 18. Further, the improvement plan creation unit 10 includes an improvement candidate route determination unit 11, a device assignment unit 12, an improvement plan generation unit 13, an improvement candidate route storage unit 14, a device assignment information storage unit 15, and an improvement plan storage unit 16.

The improvement candidate route determination unit 11 receives, as input information, the conveyance request history information D1 (described later with reference to FIG. 8A) of the objects from a conveyance request history database ("database" will be hereinafter referred to as "DB") 51, receives the movement history information D2 (described later with reference to FIG. 8B) of the objects from a movement history DB 52, receives the layout information D3 (described later with reference to FIG. 4) from a layout DB 53, and receives the conveyance route information D4 (described later with reference to FIG. 6) from a conveyance route DB 54.

The conveyance request history information D1 (described later with reference to FIG. 8A) of the objects includes the request for moving the objects from a conveyance source to a conveyance destination, and the occurrence time of the request, etc.

The movement history information D2 of the objects (described later with reference to FIG. 8B) represents the actual movement locus of the objects by the coordinates at a certain time and the conveyance route during stay. The record of the movement history may be transmitted from the conveyance vehicle at a fixed cycle, or may be requested by a management server if the management server exists. In addition to recording the movement history at a fixed cycle, the movement history may be recorded when an event occurs, for example, when the object passes through a marker (e.g., QR (Quick Response) code (registered trademark)) arranged at a fixed position. Also, together with the movement locus of the object, the movement locus of the conveyance vehicle moving without the object may be recorded. This is because, even when the conveyance vehicle is not conveying the object, it may affect the traffic jam of the conveyance vehicles.

The layout information D3 (described later with reference to FIG. 4) is information of the position of the objects and functions in the factory and the warehouse, and expresses the position of the obstacle O (Obstacle) that the conveyance vehicle cannot pass, for example. The shape of an obstacle is expressed by, for example, the vertex coordinates of a polygon indicating the planar shape of the obstacle, the coordinates defining a straight line or a curve forming the contour of the obstacle, the center coordinates and the radius of the circle if the obstacle is circular, and the like. In addition, if an area is defined for each particular function, the obstacle may be expressed by the ID (Identifier) of that area. Examples of the obstacles are manufacturing device, the device operator's workshop, etc. Also, when the layout is managed by dividing it into a plurality of sub-areas, the obstacle may be expressed by the ID of the sub-area. In that case, the area where the conveyance vehicle can pass may also be expressed by the ID of the sub-area in the same manner. As yet another example, the layout may be divided into sub-areas, and a flag may be used to express the passability of the conveyance vehicle of each sub-area. Further, as is often used in the conveyance vehicles that utilize the line tracing, the conveyance routes through which the conveyance vehicle passes may be expressed by lines (shape information of lines such as coordinates of start points, end points and passing points as well as curvatures of the lines). Further, information about the passable direction such as one-way passage may be added.

The conveyance route information D4 (described later with reference to FIG. 6) represents the conveyance routes in which the objects are conveyed. For example, the conveyance route information D4 represents a conveyance source S (Source), a conveyance destination D (Destination) and passing points of each conveyance route R (Route). Examples of the passing point include a point where the direction changes, a point where an environment-installed type sensor for measuring environmental conditions such as a temperature sensor, a humidity sensor or an illuminance sensor is arranged, a point where a marker indicating a position or a command to be read by the conveyance vehicle is arranged, arbitrary coordinates, and the like.

Based on these input information, the improvement candidate route determination unit 11 identifies at least a part of the conveyance route, i.e., a point or an area on the conveyance routes, that has a high need for improvement, and determines it as the improvement candidate route. Specifically, the improvement candidate route determination unit 11 calculates values such as the residence time of the object, the average value of the conveyance time, or the number of times that those values exceed the allowable value, for a plurality of points or areas on the conveyance route. Next, based on the calculated values, the improvement candidate route determination unit 11 calculates the improvement necessity degree for each point or area. The improvement candidate route determination unit 11 calculates the improvement necessity degree by using a formula for calculating the improvement necessity degree from those values, or a table indicating the correspondence between those values and the improvement necessity degree, or the like. The improvement necessity degree becomes higher as the residence time of the object is longer, as the average value of the conveyance time is larger, and as the number of times those values exceeded the allowable value is larger. The improvement candidate route determination unit 11 determines a point or an area where the improvement necessity degree is larger than a predetermined value as the improvement candidate route. Then, the improvement candidate route determination unit 11 stores the improvement candidate route information D5 (described later with reference to FIG. 8C) indicating the improvement candidate routes into the improvement candidate route storage unit 14.

The improvement candidate route information D5 represents the conveyance route in which the necessity of improvement is high. The improvement candidate route information D5 includes a start point and an end point of the conveyance route which is the improvement candidate route, an ID of the conveyance route, a numerical value indicating the improvement necessity degree, and the like. The improvement candidate route determination unit 11 may select the improvement candidate route from all the conveyance routes or from a part of the conveyance routes. The improvement candidate route determination unit 11 may give priority to the conveyance route conveying important objects as the improvement candidate route. The improvement candidate route determination unit 11 may give priority to the conveyance route in which the conveyance vehicle of a specific type (e.g., expensive, old, or low expandability) is used, as the improvement candidate route.

The device assignment unit 12 reads out the improvement candidate route information D5 from the improvement candidate route storage unit 14. Based on the improvement candidate route information D5, the device assignment unit 12 determines the assignment of new conveyance devices, specifically, unidirectional conveyors or omnidirectional conveyors, so as to speed up each improvement candidate route and avoid interference with other conveyance routes. When unidirectional conveyors and omnidirectional conveyors are used, the conveyance efficiency can be increased by increasing the conveyance speed of the objects. Specifically, the device assignment unit 12 first calculates the area occupied by the conveyance vehicle conveying the objects on the improvement candidate route and on the conveyance route intersecting the improvement candidate route. Next, the device assignment unit 12 calculates an intersection area between the improvement candidate route and an area occupied by the conveyance vehicle conveying the objects on the conveyance route intersecting the improvement candidate route. Then, the device assignment unit 12 assigns an omnidirectional conveyor to at least a part of the intersection area, and assigns a unidirectional conveyor to other parts. The device assignment unit 12 stores the assignment of the conveyance devices into the device assignment information storage unit 15 as the device assignment information D6 (described later with reference to FIG. 13). The device assignment information D6 represents the type of conveyor that is assigned to the improvement candidate route and can improve the conveyance efficiency without disturbing other conveyance routes.

The improvement plan generation unit 13 reads out the device assignment information D6 from the device assignment information storage unit 15. The improvement plan generation unit 13 generates, as an improvement plan, a combination of at least a part of the improvement candidate routes to which the conveyance device included in the inputted device assignment information D6 is assigned. If there are four improvement candidate routes, the improvement plan will be a combination that improves one or more of those four improvement candidate routes. The improvement plan generation unit 13 stores the improvement plan information D7 (described later with reference to FIG. 16) indicating the improvement plan into the improvement plan storage unit 16. The improvement plan information D7 represents a combination of presence and absence of the improvement of the improvement candidate routes. The improvement plan may be a combination of all of the improvement candidate routes, and may be a combination of the improvement candidate routes of a certain number or less. Also, the improvement plan may be a combination of the improvement candidate routes that satisfy a certain condition (e.g., the number of the improvement candidate routes to be improved is equal to or less than three).

The improvement plan evaluation unit 20 reads out the improvement plan information D7 from the improvement plan storage unit 16, and receives the conveyance device information D8 from the conveyance device DB 55. The conveyance device information D8 (described later with reference to FIG. 17) indicates the conveyance device, its conveyance efficiency and the replacement cost required for newly introduce the conveyance device. The conveyance device is, for example, an omnidirectional conveyor, a unidirectional conveyor or a conveyance vehicle. For each conveyance device, there may be a plurality of types of devices whose processing performance is different from each other. The conveyance efficiency is, for example, an average value, a maximum value or a most frequent value of a number or quantity of objects that can be conveyed per unit time. As the conveyance efficiency, energy required for conveyance may be considered. For example, a value obtained by dividing or weighting the conveyance efficiency value by the amount of electrical energy required for conveyance may be used. Thus, even when the conveyance efficiency is high, if the required electrical energy is large, the evaluation of the conveyance efficiency is lowered, and it becomes possible to correct the conveyance efficiency from the viewpoint of cost. The replacement cost is, for example, the price of new introduction per unit area, unit length or a number. The replacement cost may include running costs for a certain period of time, such as maintenance costs.

The improvement plan evaluation unit 20 evaluates each improvement plan in accordance with the improvement plan information D7, the conveyance device information D8 and the processing given by the evaluation formula (formula (1) described later) and the cost calculation formula (formula (2) described later) prepared in advance. Specifically, the improvement plan evaluation unit 20 calculates the evaluation index according to the processing given by the evaluation formula, and calculates the required cost according to the processing given by the cost calculation formula. The evaluation index indicates the conveyance efficiency of the whole conveyance system when the conveyance devices are assigned according to the improvement plan, e.g., the throughput of the objects and the compliance rate of the delivery date of the objects. The improvement plan evaluation unit 20 stores the evaluation index and the required cost thus calculated into the evaluation result storage unit 17 as the evaluation result information D9 (described later with reference to FIG. 18). The evaluation result information D9 is the calculation result of the evaluation index and the required cost for each improvement plan.

The improvement plan determination unit 30 reads out the evaluation result information D9 from the evaluation result storage unit 17, and receives the allowable cost information D10 (described later with reference to FIG. 19) from the allowable cost DB 56. The allowable cost information D10 represents the cost allowed by the user. There may be more than one allowable cost for each level of improvement. The improvement plan determination unit 30 selects the improvement plan bywhich the evaluation index becomes the maximum, from the improvement plans by which the required cost is equal toor lower than the allowable cost, based on the evaluation result information D9 and the allowable cost information D10. The improvement plan determination unit 30 stores the selected improvement plan into the best improvement plan storage unit 18 as the best improvement plan D11.

The improvement plan presentation unit 40 reads out the best improvement plan D11 from the best improvement plan storage unit 18. The improvement plan presentation unit 40 presents the inputted best improvement plan D11 to the user. For example, the improvement plan presentation unit 40 displays the conveyance route to be improved and the assignment of the conveyance devices in the best improvement plan D11 on the display unit 4. At that time, the improvement plan presentation unit 40 may display the best improvement plan by coloring a part to which a conveyer is newly assigned to improve the conveyance efficiency differently from other parts. Further, the improvement plan presentation unit 40 may display the best improvement plan by using an AR (Augmented Reality) or VR (Virtual Reality) so that the user can intuitively easily understand. If there is no improvement plan that satisfies the allowable cost, the improvement plan presentation unit 40 may recommend the compromise of the allowable cost with which an improvement plan can be found.

In FIG. 2, the improvement candidate route determination unit 11, the device assignment unit 12 and the improvement plan generation unit 13 of the improvement plan creation unit 10, and the improvement plan evaluation unit 20 and the improvement plan determination unit 30 can be configured by the processor 2 shown in FIG. 1, and the improvement plan presentation unit 40 can be configured by the display unit 4. The improvement candidate route storage unit 14, the device assignment information storage unit 15, the improvement plan storage unit 16, the evaluation result storage unit 17 and the best improvement plan storage unit 18 can be configured by the memory 3 shown in FIG. 1. Further, the conveyance request history DB 51, the movement history DB 52, the layout DB 53, the conveyance route DB 54, the conveyance device DB 55 and the allowable cost DB 56 can be configured by the database 5 shown in FIG. 1.

Operation Example

Figure 3:
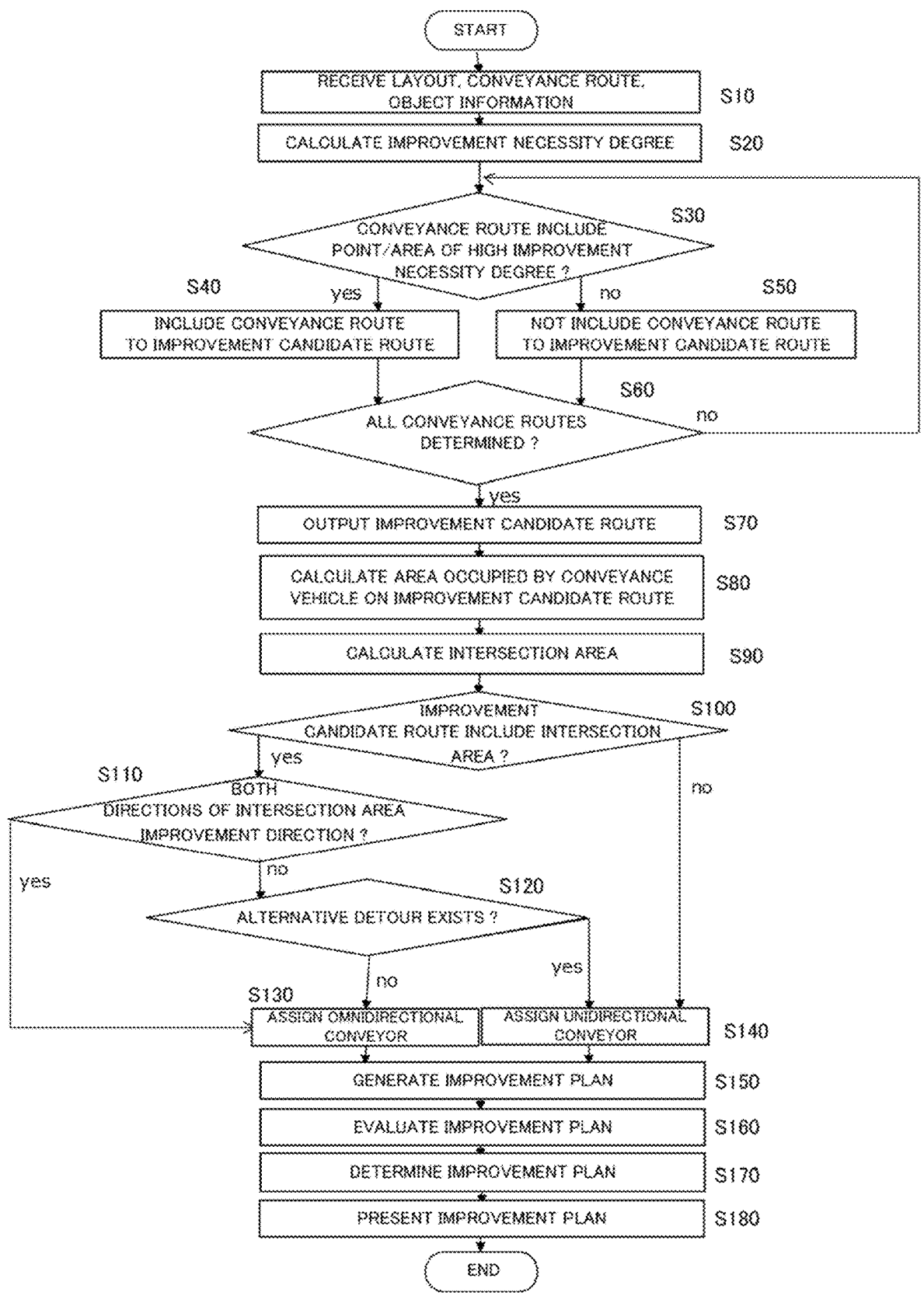
FIG. 3 is a flowchart illustrating an operation example of the conveyance route design device according to the first example embodiment.

Next, an operation example of the conveyance route design device 1 according to the first example embodiment will be described. FIG. 3 is a flowchart of conveyance route improvement processing executed by the conveyance route design device 1. This processing is realized by the processor 2 shown in FIG. 1 which executes a program prepared in advance and stored in the memory 3.

First, the improvement candidate route determination unit 11 of the improvement plan creation unit 10 receives the conveyance request history information D1 of the objects, the movement history information D2 of the objects, the layout information D3 and the conveyance route information D4 (Step S10).

Figures 4, 5:
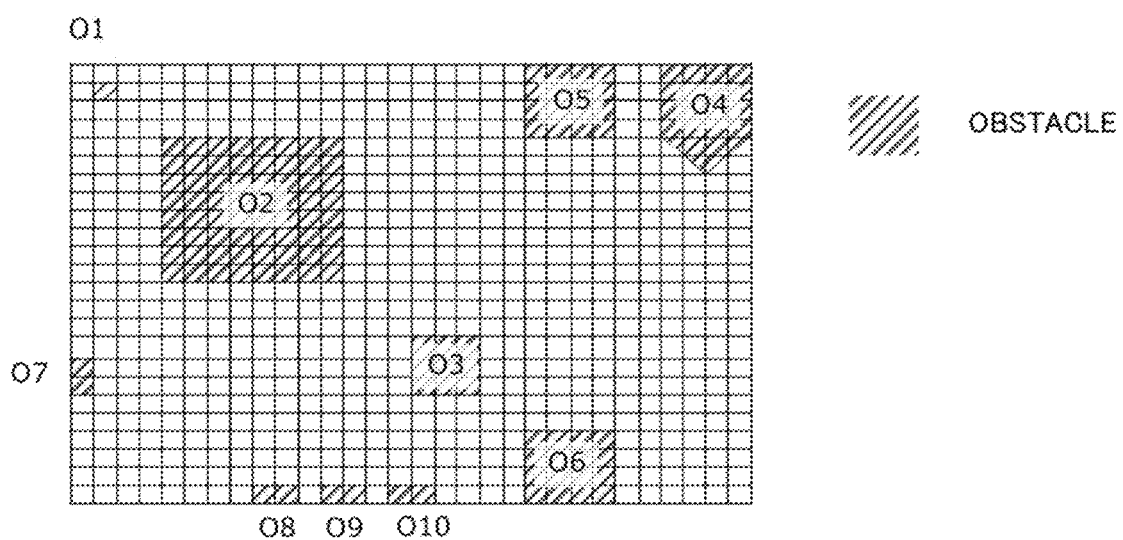
FIG. 4 illustrates an example of layout information.
FIG. 5 is a plan view illustrating a physical arrangement of obstacles indicated by the layout information of FIG. 4.

FIG. 4 illustrates an example of the layout information D3. In the example of FIG. 4, the layout information D3 includes the obstacle ID and the vertex coordinates of the obstacle shape. The "obstacle ID" is an identifier assigned to each obstacle. The "vertex coordinates of the obstacle shape" are coordinates indicating the position of each obstacle. Here, the shape of the impassable obstacle is expressed by the vertex coordinates of the polygon. FIG. 5 illustrates the physical arrangement of obstacles O1 to O10 in the layout information D3 of FIG. 4. Each obstacle is illustrated by an obliquely-lined area.

Figures 6, 7:
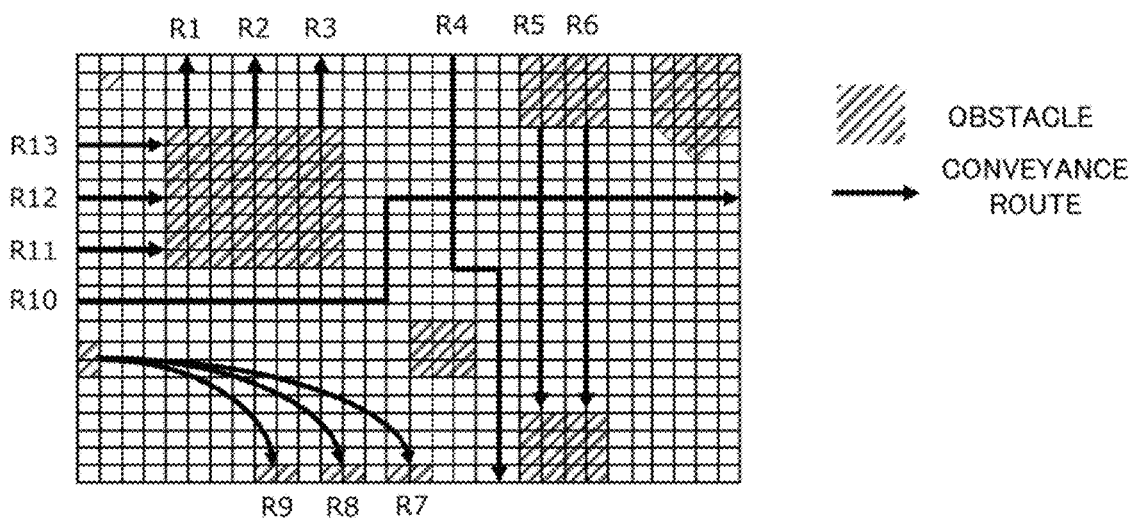
FIG. 6 illustrates an example of conveyance route information.
FIG. 7 is a plan view illustrating a physical arrangement of the conveyance routes indicated by the conveyance route information of FIG. 6.

FIG. 6 shows an example of the conveyance route information D4. In the example of FIG. 6, the conveyance route information D4 includes a conveyance route ID, a conveyance source, a conveyance destination, a passing point and a shape. The "conveyance route ID" is an identifier assigned to each conveyance route. The "conveyance source" indicates the coordinates of the start point of the conveyance route, and the "conveyance destination" indicates the coordinates of the end point of the conveyance route. The coordinates are defined by the x-coordinate in the horizontal direction and the y-coordinate in the vertical direction in the plan view shown in FIG. 5. The "passing point" indicates the coordinates that the conveyance device passes during the movement from the coordinates of the conveyance source to the coordinates of the conveyance destination. The "shape" indicates the shape of the conveyance route viewed in a planar manner. FIG. 7 illustrates the physical arrangement of the conveyance routes R1 to R13 in the conveyance route information D4 of FIG. 6. Each conveyance route is represented by a solid arrow.

FIG. 8A illustrates an example of the conveyance request history information D1 of the objects. In the example of FIG. 8A, the conveyance request history information D1 of the objects includes a conveyance request ID, a conveyance source, a conveyance destination, a time of request, an object ID, a deadline and a conveyance device ID. The "conveyance request ID" is an identifier assigned to each conveyance request. The "conveyance source" indicates the coordinates of the point where the object exists, and the "conveyance destination" indicates the coordinates of the destination of the object. The "time of request" is the time when the conveyance request occurred. The "object ID" is the identifier of the object to be conveyed. The "deadline" indicates the time when the object conveyance should be completed. The "conveyance device ID" is the identifier of the conveyance device used for the conveyance of the object. Incidentally, the conveyance device ID is defined by the conveyance device information D8 which will be described later with reference to FIG. 17.

FIG. 8B shows an example of the movement history information D2 of the objects. In the example of FIG. 8B, the movement history information D2 includes a movement history ID, current coordinates, a conveyance route ID during stay, time, a conveyance request ID and a conveyance device ID. The "movement history ID" is an identifier assigned to each movement history information. The "current coordinates" are the position coordinates of the object when its movement history information is generated. The "conveyance route ID during stay" is the conveyance route ID of the conveyance route to which the position of the object belongs. The "time" is the time when the movement history information is generated. The "conveyance request ID" is the ID of the conveyance request on which the movement history of the object is based. The "conveyance device ID" is the ID of the conveyance device conveying the object.

After step S10 in FIG. 3, the improvement candidate route determination unit 11 calculates the improvement necessity degree for each point or area using the average value of the residence time or the conveyance time of the object, the number and the ratio of times that the average value exceeds the allowable value, or a formula of adding them together with weights, based on the conveyance request history information D1 of the objects, the movement history information D2 of the objects, the layout information D3 and the conveyance route information D4 (Step S20). Here, the point may be coordinates, for example. The area is represented by, for example, a set of a start point and an end point of a straight line or curve, or vertex coordinates of a polygon. The point or area may be at least a part of the conveyance route. Also, if the areas are divided for each specific function, the area may be the unit thus divided. Further, when the layout is managed by dividing the layout into sub-areas, the improvement necessity degree may be calculated for each sub-area.

Next, the improvement candidate route determination unit 11 determines a point or an area where the improvement necessity degree is high. For example, when the improvement necessity degree is higher than a predetermined threshold value, the improvement candidate route determination unit 11 determines that the improvement necessity degree at that point or area is high. The threshold value may be a value set by the user, or may be a value which is a constant value or a constant ratio higher than the average value, the most frequent value or the intermediate value of the improvement necessity degree of the surrounding areas. The improvement candidate route determination unit 11 may determine the place (area, point, etc.) that satisfies criteria for determining whether or not the conveyance amount actually conveyed is improved with respect to the request amount to be conveyed via the conveyance route, among the system including a plurality of conveyance routes. The criteria for determining whether or not the conveyance amount is improved is, for example, the criteria which determines that a certain place needs improvement when the conveyance amount actually conveyed is smaller than the request amount to be conveyed through the conveyance route in the certain place. The criteria for determining whether or not the conveyance amount is improved is, for example the criteria which determines that a certain place does not need improvement when the conveyance amount actually conveyed is in the same level as the request amount to be conveyed through the conveyance route in the certain place. Hereinafter, a point or area is collectively referred to as a "place," and a point or area whose improvement necessity degree is high is referred to as an "improvement target place."

The improvement target place is identified, for example, as follows. First, the improvement candidate route determination unit 11 extracts the places where the conveyance capacity is insufficient for the conveyance request. The criterion for judging that the conveyance capacity is insufficient for the conveyance request is, for example, that the residence time of the object is long just before entering the position. Also, when the place where the conveyance capacity is insufficient is the conveyance route itself, the criterion is that the residence time of the object waiting to be conveyed from the conveyance source is long. Specifically, when the average, the most frequent value or the intermediate value of the residence time is equal to or larger than a certain threshold value, the improvement candidate route determination unit 11 determines that the residence time is long. At this time, the improvement candidate route determination unit 11 may consider the residence time within a certain time window. Further, the improvement candidate route determination unit 11 may determine that the residence time is long, when the time in which the CDF (Cumulative Distribution Function) of the residence time becomes equal to or larger than a constant value is equal to or longer than a constant threshold value. The residence time can be calculated, for example, from the difference between the time when the conveyance request of the objects arrives, which is obtained from the conveyance request history information D1, and the time when the conveyance of the objects actually begins, which is obtained from the movement history information D2 of the objects.

Next, the improvement candidate route determination unit 11 classifies the extracted improvement target places based on factors of the insufficient conveyance capability, and extracts the places for which speedup by conveyers is required. Concrete methods are described below.

First, the improvement candidate route determination unit 11 determines whether or not the extracted place satisfies the following conditions.

<Conditions>:

The time required to convey the objects (conveyance time) is long. For example, the improvement candidate route determination unit 11 determines that the conveyance time is long when the average, the most frequent value or the intermediate value of the conveyance time is equal to or larger than a certain threshold value (for example, 1.3 times the conveyance time in a situation where there is no congestion). At this time, the improvement candidate route determination unit 11 may consider the conveyance time within a certain time window. Also, the improvement candidate route determination unit 11 may determine that the conveyance time is long when the time at which the CDF of the conveyance time is equal to or larger than a certain value is equal to or longer than a certain threshold value. Further, the improvement candidate route determination unit 11 may determine that the conveyance time is long, when the ratio of the time in which the speed of the conveyance vehicle during conveyance is equal to or smaller than a constant speed is equal to or larger than a constant value, or when the ratio of the conveyance vehicles whose conveyance time is equal to or longer than a constant conveyance time is equal to or larger than a constant value.

Next, based on the above-described determination result, the improvement candidate route determination unit 11 classifies the extracted improvement target places into the following two cases (Case A) or (Case B) based on a factor of the conveyance capacity insufficient for the conveyance request. Specifically, the improvement candidate route determination unit 11 classifies the improvement target place as Case A when the above-described condition is satisfied, i.e., when the conveyance time is long and the conveyance vehicle is conveying the objects at a low speed so that it is considered that a traffic jam has occurred. On the other hand, the improvement candidate route determination unit 11 classifies the improvement target place as Case B when the above-described condition is not satisfied, i.e., the conveyance time is not long.

(Case A) Many conveyance vehicles have already been introduced relative to the traffic capacity of the conveyance route, and there is no margin in the traffic capacity of the conveyance route. Since the traffic jam gets worse if the number of the conveyance vehicles is further increased, it is difficult to efficiently raise the conveyance efficiency.

(Case B) There is still a margin in the traffic capacity of the conveyance route, but the residence time is long because the number of the conveyance vehicles is small. Adding the conveyance vehicles may improve the conveyance efficiency.

When the extracted place is classified as Case A, the improvement candidate route determination unit 11 determines the place as the improvement target place, and proceeds to the next step S30. On the other hand, when the extracted place is classified as Case B, there is a possibility that the conveyance efficiency of the route can be improved by increasing the number of conveyance vehicles, rather than by introducing a conveyor, and therefore the improvement candidate route determination unit 11 excludes the place from the target of the improvement of the conveyance efficiency by using a conveyor. Namely, the improvement candidate route determination unit 11 does not determine the place as the improvement target place. However, if it is desirable to increase the speed by introducing the conveyor, such as when the price of a new conveyance vehicle is high (when a luxury conveyance vehicle is required) or when it is difficult to add a new conveyance vehicle because of a high introduction cost to the site, the improvement candidate route determination unit 11 may determine the place as the improvement target place even in Case B.

Next, the improvement candidate route determination unit 11 determines whether or not each conveyance route includes a point or an area of a high improvement necessity degree, i.e., an improvement target place (Step S30). When the conveyance route includes the improvement target place (Step S30: yes), the improvement candidate route determination unit 11 includes at least a part of the conveyance route in the improvement candidate route (Step S40). At this time, the improvement candidate route determination unit 11 may include the whole part of the conveyance route in the improvement candidate route, and may include only a part including a point or an area having a high improvement necessity degree in the improvement candidate route. On the other hand, when the conveyance route does not include the improvement target place (Step S30: no), the improvement candidate route determination unit 11 does not include the conveyance route in the improvement candidate route (Step S50).

Next, the improvement candidate route determination unit 11 determines whether or not the above-described determination has been completed for all the conveyance routes (Step S60). If the determination for all the conveyance routes has not been completed yet (Step S60:no), the improvement candidate route determination unit 11 returns to Step S30 and determines the next conveyance route. On the other hand, when the determination has been completed for all the conveyance routes to be determined (Step S60: yes), the improvement candidate route determination unit 11 proceeds to the next step S70. Incidentally, the conveyance route to be determined may be all the conveyance routes, or specific conveyance routes may be excluded. Also, the conveyance route to be determined may be a conveyance route of a specific number, length, and area. Further, the user may input the conveyance route to be included in the determination target, or the conveyance route to be excluded from the determination target.

Figure 9:
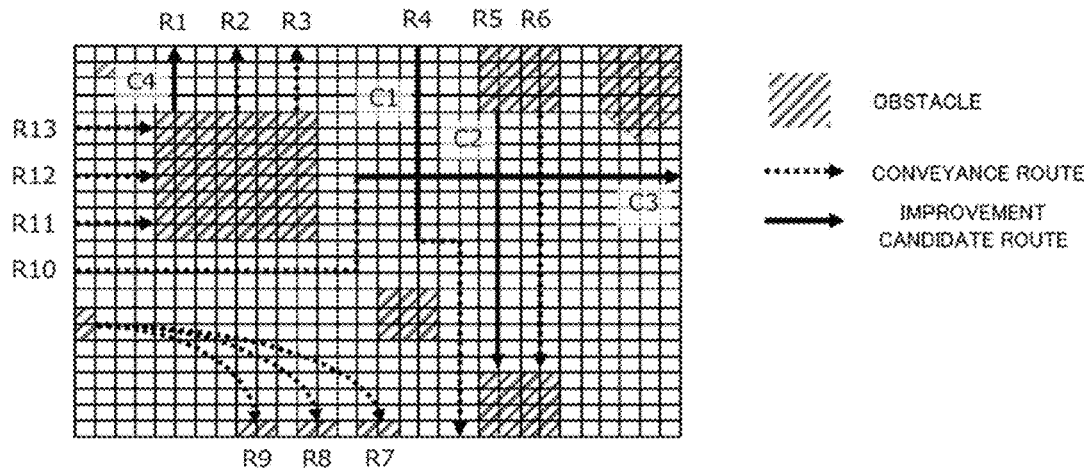
FIG. 9 is a plan view illustrating a physical arrangement of improvement candidate routes.

Next, the improvement candidate route determination unit 11 outputs the improvement candidate route information including all the obtained improvement candidate routes to the improvement candidate route storage unit 14 (Step S70). FIG. 8C illustrates an example of the outputted improvement candidate route information. Also, FIG. 9 illustrates the physical arrangement of the improvement candidate routes shown in FIG. 8C. In FIG. 9, the conveyance route is indicated by a dotted line arrow, and the improvement candidate route is indicated by a solid line arrow. In this example, four improvement routes C1-C4 are outputted. In this example, the improvement candidate route C2 represents the entire conveyance route R5, and the improvement candidate route C4 represents the entire conveyance route R1. However, the improvement candidate route C3 represents a part of the conveyance route R10, and the improvement candidate route C1 represents a part of the conveyance route R4. Thus, even among the same conveyance routes, there are cases where only a part becomes an improvement candidate route.

Next, the device assignment unit 12 calculates the area (footprint) occupied by the conveyance vehicle at the time of conveying the objects on the improvement candidate route, and on the conveyance route which is not the improvement candidate route and which intersects the improvement candidate route, based on the improvement candidate route information (Step S80). At this time, the area occupied by the conveyance vehicle may be the shape of the conveyance vehicle itself, and may be the area occupied by the conveyance vehicle including the object if the object is larger than the conveyance vehicle. Also, the area occupied by the conveyance vehicle may be the shape of a square or a circle for simplicity. Further, the area occupied by the conveyance vehicle may be an area including a certain margin in consideration of errors.

Figure 10:
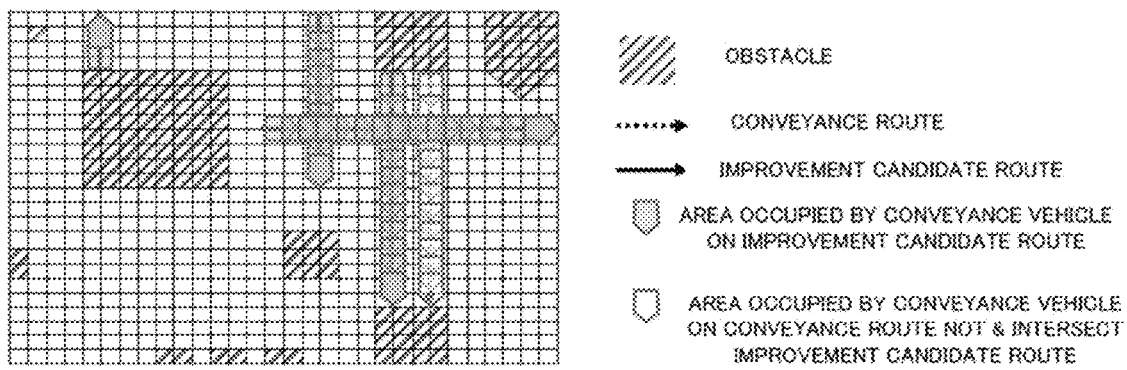
FIG. 10 is a plan view illustrating areas occupied by conveyance vehicles on the improvement candidate routes and the conveyance routes.

FIG. 10 illustrates an example of the physical arrangement of the areas occupied by the conveyance vehicle when the improvement candidate route shown in FIG. 9 is given. The area occupied by the conveyance vehicle on the improvement candidate route is indicated by a gray pentagon, and the area occupied by the conveyance vehicle on the conveyance route, which is not an improvement candidate and which intersects the improvement candidate route, is represented by a white pentagon.

Figure 11:
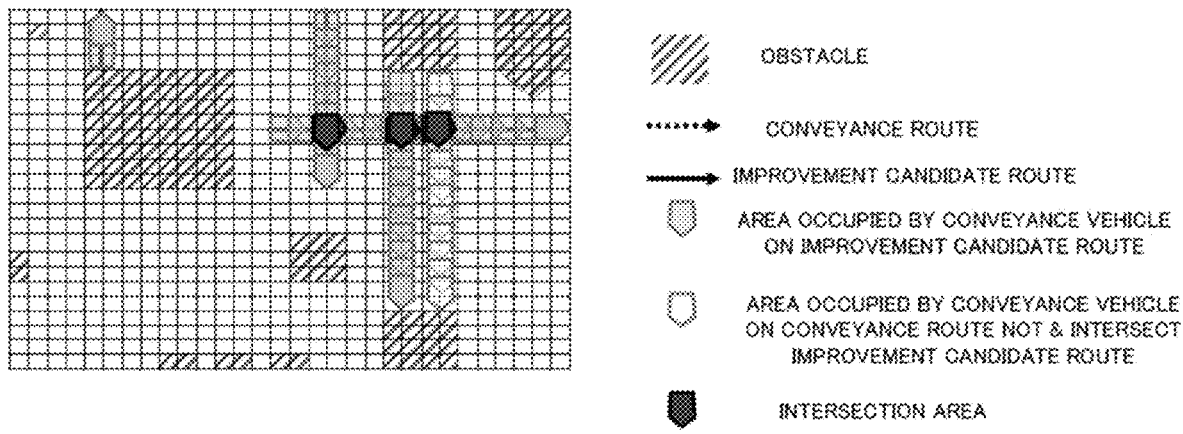
FIG. 11 is a plan view illustrating intersection areas.

Next, the device assignment unit 12 calculates an area where the areas occupied by the convenance vehicle thus calculated overlap with each other (hereinafter referred to as "intersection area.") (Step S90). FIG. 11 illustrates an example of the physical arrangement of the intersection areas when the physical arrangement of the areas occupied by the conveyance vehicle shown in FIG. 10 is given. In the example of FIG. 11, the intersection area is represented by a black pentagon. The intersection area may be an area that is strictly overlapped, or may be an area including a certain margin in consideration of errors.

Next, the device assignment unit 12 determines whether or not each improvement candidate route includes the intersection area (Step S100). When the improvement candidate route contains the intersection area (Step S100: yes), the process proceeds to step S110. On the other hand, when each improvement candidate route does not include the intersection area (Step S100: no), the process proceeds to step S140.

In Step S110, the device assignment unit 12 determines one or more conveyance direction (hereinafter, also referred to as an "improvement direction") in which the conveyance efficiency should be improved in the intersection area, according to the flow rate of the objects passing through the intersection areas in the respective conveyance directions. Specifically, as to the improvement candidate route in the intersection area, the device assignment unit 12 determines the conveyance direction as the improvement direction. On the other hand, as to the conveyance route which is not the improvement target and which intersects the improvement candidate route (hereinafter referred to as "non-improvement candidate route"), the device assignment unit 12 determines the conveyance direction as the improvement direction, when the flow rate in the conveyance direction is equal to or larger than a predetermined threshold value. The flow rate may be throughput of the objects per unit time, absolute quantity, shipping quantity with respect to incoming quantity, or a ratio, an average value, a most frequent value, an intermediate value with respect to quantity of objects carried by other conveyance routes (including intersecting improvement candidate routes). The flow rate within a certain time window may be considered.

Specifically, as to the intersection area of the improvement candidate routes, the improvement directions in the intersection area are both conveyance directions. Therefore, the device assignment unit 12 assigns the omnidirectional conveyor to the intersection area. In other words, the device assignment unit 12 determines the conveyance device to be assigned to the area where the conveyance routes intersect, depending on whether or not the conveyance route including the improvement target place intersects. As to the intersection area of the improvement candidate route and the non-improvement candidate route, the flow rate in the conveyance direction of the non-improvement candidate route is considered. When the flow rate in the conveyance direction of the non-improvement candidate route is larger than a threshold value, the improvement direction of the conveying efficiency in the intersection area are both conveyance directions. Therefore, the device assignment unit 12 assigns the omnidirectional conveyor to the intersection area (Step S130).

On the other hand, when the flow rate in the conveyance direction of the non-improvement candidate route is smaller than the threshold value, only the conveyance direction of the improvement candidate route is the improvement direction. In this case, the device assignment unit 12 determines whether or not there is an alternative detour for the non-improvement candidate route (Step S120). When there is an alternative detour for the non-improvement candidate route (Step S120: yes), the device assignment unit 12 assigns a unidirectional conveyor in the conveyance direction of the improvement candidate route to the intersection area, and sets the detour as a new conveyance route of the conveyance vehicle for the non-improvement candidate route (Step S140). The new conveyance route generates, for example, the shortest pass. Thus, it is possible to prevent the cost inefficient selection that introduces the omnidirectional conveyor even when the object rarely flows to one of the conveyance routes forming the intersection area.

On the other hand, when there is no alternative detour for the non-improvement candidate route (Step S120: no), the device assignment unit 12 also assigns an omnidirectional conveyor to this intersection area (Step S130). The device assignment unit 12 determines that there is no alternative detour, when there is no alternative detour due to factory or warehouse layout, for example. Additionally, the device assignment unit 12 may determine that there is no alternative detour when there is no appropriate alternative detour, such as when an alternative detour exists, but the alternative detour greatly worsen the conveyance time or the conveyance time requirements cannot be met.

Further, in Step S100, when the improvement candidate route does not include the intersection area (Step S100: no), since it is sufficient to improve the conveyance efficiency in one direction, the device assignment unit 12 assigns a unidirectional conveyor to the improvement candidate route (Step S140). Incidentally, even for the improvement candidate routes including the intersection area, the device assignment unit 12 assigns a unidirectional conveyor to the areas other than the intersection area.

In this way, it is possible to assign the conveyance devices so as not to interfere with other conveyance routes while suppressing the introduction of the high-cost omnidirectional conveyor. FIG. 12 illustrates the physical arrangement of the assignments of the conveyance devices generated from the physical arrangement of the areas occupied by the conveyance vehicles and the intersection areas shown in FIG. 11. In FIG. 12, the assigned area of the high-cost omnidirectional conveyor is shown in dark gray, while the assigned area of the low-cost unidirectional conveyor is shown in light gray.

FIG. 13 shows the device assignment information to the improvement candidate route in the case of FIG. 12. The "assignment ID" is an identifier assigned to each assignment of the conveyance device. The "improvement candidate route ID" indicates the ID of the improvement candidate route corresponding to the assignment ID. The "start point" and "end point" are the coordinates of the start point and the end point of the range to which the conveyance device is assigned. The "type of conveyor" indicates the type of conveyance device to be assigned to each area of the improvement candidate route. Although the coordinates of the improvement candidate route are represented by a point in the table of FIG. 13, the conveyance vehicle has a certain size. Therefore, as the intersection area of the area occupied by the conveyance vehicle, it is noted that the assignment IDs "A8" and "A2" correspond to the intersection area of the improvement candidate routes C1 and C3, and the assignment IDs "A10" and "A5" correspond to the intersection area of the improvement candidate routes C2 and C3. Also, in the examples of FIGS. 12 and 13, there is no appropriate detour for the assignment ID "A11" which is the intersection area of the improvement candidate route C3 and the non-improvement candidate route R6, and hence the omnidirectional conveyor is assigned.

Figures 14, 15:
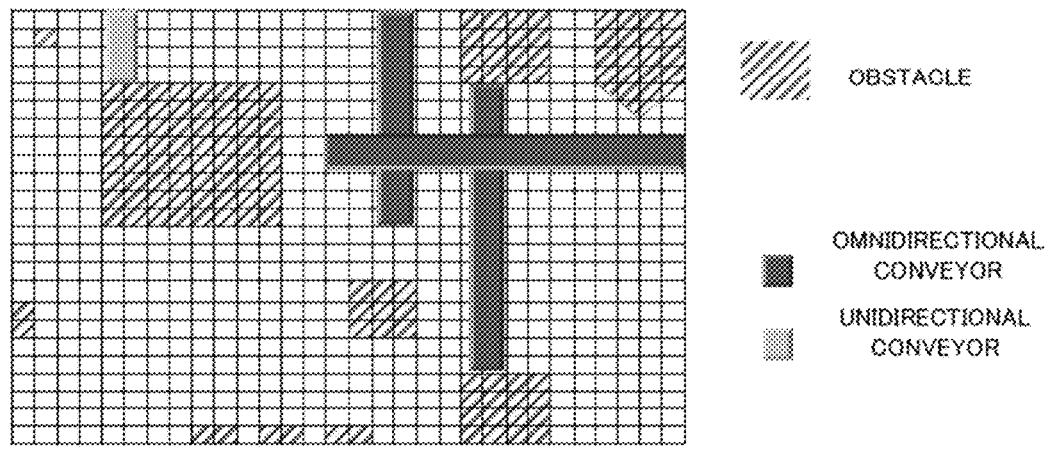
FIG. 14 is a plan view illustrating another assignment example of the conveyance devices to the improvement candidate routes.
FIG. 15 illustrates device assignment information corresponding to the assignment example of FIG. 14.

For reference, it should be noted that, as an extreme example, if the cost is not considered for a certain reason, e.g., the allowable cost is very high, all the improvement candidate routes intersecting other conveyance routes may become the omnidirectional conveyors. The physical arrangement of the conveyance devices in this case is shown in FIG. 14, and an example of the device assignment information of FIG. 14 is shown in FIG. 15. The following description will proceed with reference to FIG. 13 as an example.

As described above, the device assignment unit 12 assigns the omnidirectional conveyor to at least a part of the improvement candidate route including the intersection area (Step S130), and assigns the unidirectional conveyor to the improvement candidate route not including the intersection area (Step S140). Thus, the device assignment unit 12 can assign the conveyance device (unidirectional/omnidirectional conveyor) to each area of the improvement candidate route such that each improvement candidate route can efficiently speed up in terms of cost without interference with other conveyance routes.

Next, the improvement plan generation unit 13 generates, as an improvement plan, combinations of the improvement candidate routes to which the conveyance devices are assigned (Step S150). The improvement plan may be generated for some combinations or all combinations. When the improvement plan is generated for all combinations, the number of combinations is 2^(number of improvement candidate routes) (where "+" represents a power). The improvement plan may be generated until the combination reaches a predetermined number. Also, specific combinations may be excluded. For example, a particular area or the conveyance route of a particular conveyance vehicle may be excluded. As an example, one of the three unidirectional conveyors of introduction candidates having lowest expandability may be excluded. As another example, in a particular area where possibility of changing the conveyance vehicle is high, a conveyance vehicle may be left without introducing a conveyor. FIG. 16 shows the improvement plan information when all combinations are listed as the improvement plans based on FIG. 13. In the improvement plan information, the "improvement plan ID" is the identifier assigned to each improvement plan. FIG. 16 shows the improvement plan information when there are four improvement candidate routes C1-C4. In FIG. 16, for comparison, the combination in which all the improvement candidate routes C1 to C4 are not improved is shown as the "improvement plan I1 (present)".

Next, the improvement plan evaluation unit 20 calculates the evaluation index and the required cost for each improvement plan in accordance with the improvement plan information D7 generated by the improvement plan generation unit 13, the conveyance device information D8, and the processing indicated by the evaluation formula and the cost calculation formula prepared in advance, and evaluates the improvement plan (Step S160). FIG. 17 illustrates an example of the conveyance device information. The "conveyance device ID" is an identifier assigned to each conveyance device. The "description" indicates the contents of each conveyance device. The "average conveyance efficiency" indicates the average conveyance efficiency of each conveyance device, and the "replacement cost" indicates the replacement cost of each conveyance vehicle. This example represents the average conveyance efficiency (e.g., the average value of the amount of objects that can be conveyed per unit time) and the replacement cost (e.g., the cost per unit length when a conveyance vehicle is replaced with a conveyor), for the three types of conveyance vehicles including the omnidirectional conveyor, the unidirectional conveyor and the conveyance vehicle. FIG. 18 illustrates examples of the calculated required cost and the evaluation result of the evaluation index calculated according to the processing expressed by the evaluation formula. In the evaluation result information of FIG. 18, the "improvement plan ID" is an identifier of the improvement plan to be evaluated. The "required cost" is the cost required by each improvement plan, and is obtained by the processing expressed by the cost calculation formula (2) described later. The "evaluation index" indicates the value of the evaluation index of each improvement plan calculated according to the processing expressed by the evaluation formula (1) described later.

Evaluation of each improvement plan can be made using common technologies. Evaluation indices to be evaluated according to the processing expressed by the evaluation formula are, for example, throughput of the objects as a whole of factory and warehouse, and compliance rate of delivery date of the objects. The simplest example of the evaluation formula for calculating the evaluation index for each improvement plan is the following formula. The improvement plan evaluation unit 20 calculates the following evaluation index when the conveyance devices are assigned according to each improvement plan.

(Evaluation index)=(Average conveyance efficiency of the conveyance vehicle)×(Number of conveyance vehicle)+(Average conveyance efficiency of unidirectional conveyor)×(Quantity of unidirectional conveyor)+(Average conveyance efficiency of omnidirectional conveyor)×(Quantity of omnidirectional conveyor)  (1)

In a factory and a warehouse, layout of the factories and the warehouse, interference between conveyance vehicles and surrounding environments, interference between conveyance vehicles, arrival rate of conveyance request, arrival patterns of conveyance request, characteristics of conveyance vehicle (maximum speed, maximum acceleration, cruise speed, reliability, etc.), and priority control methods of conveyance tasks are often considered in order to more accurately evaluate the evaluation indices of conveyance efficiency. As other examples of the evaluation technique which can consider these elements, the following general methods can be utilized: Agent-based simulation which regards a conveyance vehicle as an agent, analysis of transition probability of conveyance state by Stochastic Petri Net and Stochastic Time Petri Net, and fluid simulation which regards (approximates) the objects as a fluid.

Since many computational resources are generally required for these analyses and simulations, if we comprehensively evaluate a combination plan of assigning conveyors to each area of all possible conveyance routes without using the improvement plan creation unit 10, a large number of computational resources will be required. In this embodiment, since the improvement plan creation unit 10 can drastically reduce the number of improvement plans to be evaluated, it is possible to reduce the memory required for the calculation. Also, since the computation amount and required memory are reduced, larger and more complex layouts can be evaluated with the same computational resources.

Further, the required cost of each improvement plan is calculated according to the processing expressed by the following cost calculation formula, for example.

(Required cost)=$\Sigma\_i$ (replacement cost of conveyance vehicle $i$ included in the improvement plan)×(Quantity of the conveyance vehicle $i$ included in the improvement plan)  (2)

(Note: $\Sigma\_i$ represents processing of calculating the sum for i.)

As a method of calculation, the evaluation index and the required cost of all the improvement plans may be calculated first. As another method, only the required cost may be calculated first, and then the evaluation index may be calculated only for the improvement plans having the required cost lower than the allowable cost. Also, when it is desired to find the improvement plan that achieves the maximum conveyance efficiency within the allowable cost, only the improvement plans having the required cost close to the allowable cost may be extracted and calculated. Further, when it is desired to find a plan that satisfies a certain conveyance efficiency, it is possible to start calculation of the evaluation index for the improvement plan having lower cost, and stop the calculation when the conveyance efficiency reaches the threshold. Instead, the calculation may be terminated when the calculation time exceeds a threshold value.

Next, the improvement plan determination unit 30 selects the improvement plan having the optimum evaluation result satisfying the cost constraint based on the required cost and the evaluation index of the evaluation result information, and determines it as the best improvement plan (Step S170). FIG. 19 illustrates an example of allowable cost information. The "improvement design plan" is an identifier assigned to each improvement design plan. The "allowable cost" is the allowable cost of each improvement design plan. In the example of FIG. 19, three different improvement design plans and their allowable costs are stored. The improvement plan determination unit 30 selects the improvement plan having the highest evaluation index value within the allowable cost. In the case of the improvement design plan P1 of FIG. 19, the improvement plan 15 in FIG. 18 is selected. Similarly, in the case of the improvement design plan P2, the improvement plan 18 in FIG. 18 is selected. In the case of the improvement design plan P3, the improvement plan 114 in FIG. 18 is selected. Next, the improvement plan presentation unit 40 displays the selected best improvement plan to the user by displaying it on the display unit 4 or the like (Step S180).

In the above example, the improvement plan presentation unit 40 displays only the best improvement plan on the display unit 4. Instead, the improvement plan presentation unit 40 may display a plurality of improvement plans. For example, the improvement plan presentation unit 40 may display a predetermined number of improvement plans from the upper level of the evaluation result at the same time.

As described above, in the present example embodiment, the conveyance route design device determines at least a part of the conveyance route that requires improvement as an improvement candidate route, based on at least one of the information relating to the conveyance route and the information relating to the conveyance of the objects. Then, the conveyance route design device generates the device assignment information to assign the conveyance devices including the omnidirectional conveyor, and generates, as an improvement plan, a combination of at least a part of the improvement candidate routes to which the conveyance device is assigned, based on the device assignment information. This makes it possible to improve the conveyance efficiency at a limited cost in a conveyance system including multiple types of conveyance vehicles having different conveyance characteristics and including an omnidirectional conveyor.

For example, it is supposed that a conveyor that is easy to change the layout is used, as described in the International Application WO2018/038171. Also, it is supposed that the conveyance route design device 1 makes an improvement plan using the conveyor as a conveyance device. In this case, when the device assignment unit 12 determines to assign the conveyor to a certain place, the device assignment unit 12 may control the conveyor to move to the certain location and then execute the conveyance process at the certain place. In this case, the conveyor moves to the certain place in response to the control, and then executes the conveyance process at the certain place.

Second Example Embodiment

Figure 20:
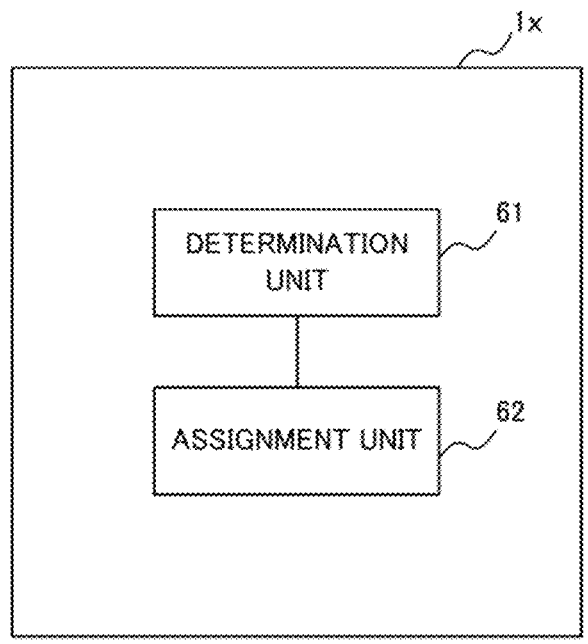
FIG. 20 is a block diagram illustrating a functional configuration of a conveyance route design device according to a second example embodiment.
Figure 21:
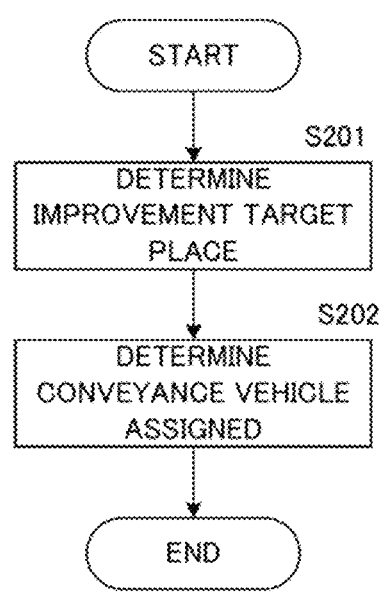
FIG. 21 is a flowchart of processing by the conveyance route design device according to the second example embodiment.

Next, a second example embodiment of the present invention will be described. In the second example embodiment, the conveyance route design device 1 performs processing of generating and storing the device assignment information. FIG. 20 is a block diagram illustrating a functional configuration of the conveyance route design device 1x according to the second example embodiment. Also, FIG. 21 is a flowchart of processing by the conveyance route design device 1x according to the second example embodiment. As shown in FIG. 20, the conveyance route design device 1x includes a determination unit 61 and an assignment unit 62. The conveyance route design device 1x determines the assignment of the conveyance devices for the conveyance system having a plurality of conveyance routes. Specifically, the determination unit 61 determines, for a plurality of conveyance routes, a place that satisfies the criteria for improving the actual conveyance amount with respect to the conveyance request amount as the improvement target place (Step S201). The determination unit 61 may be implemented using a function similar to that of the improvement candidate route determination unit 11 shown in FIG. 2.

Next, the assignment unit 62 determines the conveyance device to be assigned (Step S202). Specifically, depending on whether or not the conveyance route including the improvement target place determined in the step S201 intersects, the assignment unit 62 determines the conveyance device to be assigned to the place where the conveyance routes intersect. Examples of the conveyance device are unidirectional conveyors, omnidirectional conveyors, etc. The assignment unit 62 can be implemented using the same functions as the function of the device assignment unit 12 shown in FIG. 2. Thus, according to the second example embodiment, it is possible to appropriately assign a conveyance device to the conveyance route including the improvement target place where the conveyance amount is to be improved.

In each example embodiment described above, the processing of the conveyance route design device has been described by referring to an example in which the two conveyance routes intersect. However, three or more conveyance routes may intersect. Also, while the conveyance routes intersect orthogonally in the examples shown in FIGS. 10 and 11, it is not necessary that the conveyance routes intersect orthogonally. Namely, the conveyance route and the manner in which a plurality of conveyance routes intersect are not limited to the examples described above.

A part or all of the example embodiments described above may also be described as the following supplementary notes, but not limited thereto.

(Supplementary Note 1)

A conveyance route design device comprising:
    a determination unit configured to determine an improvement target place that satisfies criteria for improving an actual conveyance amount with respect to a conveyance request amount, for a plurality of conveyance routes; and
    an assignment unit configured to determine a conveyance device to be assigned to an intersecting position where the conveyance routes intersect, based on whether or not the conveyance route including the improvement target place intersects.

(Supplementary Note 2)

The conveyance route design device according to supplementary note 1, wherein the assignment unit assigns an omnidirectional conveyor to the intersecting position when both of the conveyance routes satisfy the criterion at the intersecting position.

(Supplementary Note 3)

The conveyance route design device according to supplementary note 1, wherein, when one of the conveyance routes does not satisfy the criterion at the intersecting position, the assignment unit determines whether or not there is a detour for the one of the conveyance routes, and
    wherein the assignment unit assigns a unidirectional conveyor to the intersecting position when there is the detour for the one of the conveyance routes, and assigns an omnidirectional conveyor to the intersecting position when there is no detour for the one of the conveyance routes.

(Supplementary Note 4)

The conveyance route design device according to supplementary note 1,
    wherein the determination unit determines at least a part of the conveyance route including the improvement target place as an improvement candidate route based on at least one of information relating to the conveyance route and information relating to conveyance of objects,
    wherein the assignment unit generates device assignment information which assigns an omnidirectional conveyor or a unidirectional conveyor to the intersecting position, and
    wherein the conveyance route design device further comprising an improvement plan generation unit configured to generate a combination of at least a part of the improvement candidate routes to which the conveyance device is assigned, as an improvement plan, based on the device assignment information.

(Supplementary Note 5)

The conveyance route design device according to supplementary note 4, further comprising:
an improvement plan evaluation unit configured to evaluate each improvement plan based on the conveyance vehicle information and outputs evaluation result;
an improvement plan determination unit configured to determine an improvement plan giving best evaluation result as the best improvement plan based on the evaluation result; and a presentation unit configured to present the best improvement plan.

(Supplementary Note 6)

The conveyance route design device according to supplementary note 5,
wherein the improvement plan evaluation unit calculates evaluation index and required cost by predetermined formulas as the evaluation result for each improvement plan, and
wherein the improvement plan determination unit determines, among the improvement plans for which the required cost is equal to or less than an allowable cost, an improvement plan for which the evaluation index is maximum as the best improvement plan.

(Supplementary Note 7)

The conveyance route design device according to supplementary note 1, wherein the determination unit determines the improvement target place based on at least one of an average value of a residence time of objects, an average value of a conveyance time of objects, a number or a percentage of times that the residence time or the conveyance time exceeds an allowable value, and a value obtained by adding the average value of the residence time, the average value of the conveyance time and the number or the percentage with weights.

(Supplementary Note 8)

The conveyance route design device according to supplementary note 4, wherein, when a residence time of objects immediately before a certain location on the conveyance route is equal to or greater than a predetermined threshold value and a conveyance time at the location is equal to or greater than a predetermined threshold value, the determination unit determines the location as an improvement target place and determines at least a part of the conveyance route including the improvement target place as the improvement candidate route.

(Supplementary Note 9)

The conveyance route design device according to supplementary note 1, wherein the assignment unit calculates an intersection area where an improvement candidate route intersects an area occupied by a conveyance vehicle at the time of conveyance of objects on a conveyance route intersecting the improvement candidate route, and assigns the conveyance device to the intersection area.

(Supplementary Note 10)

The conveyance route design device according to supplementary note 9, wherein, when flow rates of the objects in the improvement candidate route and the conveyance route forming the intersection area are both equal to or greater than a predetermined threshold value, the assignment unit assigns an omnidirectional conveyor to the intersection area, and assigns a unidirectional conveyor to the intersection area other than the intersection area to which the omnidirectional conveyor is assigned.

(Supplementary Note 11)

The conveyance route design device according to supplementary note 9, wherein the assignment unit:
determines the conveyance direction of the improvement candidate route forming the intersection area as an improvement direction,
determines the conveyance direction of the conveyance route whose flow rate of the objects is equal to or greater than a predetermined threshold value as the improvement direction among the conveyance routes other than the improvement candidate routes forming the intersection area, and
assigns the omnidirectional conveyer to the intersection area when there are plural improvement directions at the intersection area, and assigns a unidirectional conveyer to the intersection area when there is one improvement direction at the intersection area.

(Supplementary Note 12)

The conveyance route design device according to supplementary note 1,
wherein the information relating to the conveyance route includes layout information indicating positions of obstacles, and the conveyance route information indicating the route by which the objects are to be conveyed, and
wherein the information relating to the conveyance of the objects includes conveyance request history information indicating a history of the conveyance request of the objects, and movement history information indicating an actual movement history of the objects.

(Supplementary Note 13)

A conveyance route design method executed by a computer, the method comprising:
determining an improvement target place that satisfies criteria for improving an actual conveyance amount with respect to a conveyance request amount, for a plurality of conveyance routes; and
determining a conveyance device to be assigned to an intersecting position where the conveyance routes intersect, based on whether or not the conveyance route including the improvement target place intersects.

(Supplementary Note 14)

A recording medium recording a conveyance route design program that causes a computer to function as:
a determination unit configured to determine an improvement target place that satisfies a criterion for improving an actual conveyance amount with respect to a conveyance request amount, for a plurality of conveyance routes; and
an assignment unit configured to determine a conveyance device to be assigned to an intersecting position where the conveyance routes intersect, based on whether or not the conveyance route including the improvement target place intersects.

While the invention has been described with reference to example embodiments and examples thereof, the invention is not limited to these example embodiments and examples. It will be understood by those of ordinary skill in the art that various changes in form and details may be made within the scope of the present invention.

DESCRIPTION OF SYMBOLS

1 Conveyance route design device
2 Processor
3 Memory
4 Display unit
5 Database

10 Improvement plan creation unit
11 Improvement candidate route determination unit
12 Device assignment unit
13 Improvement plan generation unit
20 Improvement plan evaluation unit
30 Improvement plan determination unit
40 Improvement plan presentation unit

What is claimed is:

1. A conveyance route design device comprising:
a memory storing instructions;
a processor, which based on execution of the instructions, is configured to:
  determine an improvement target place that satisfies criteria for improving an actual conveyance amount with respect to a conveyance request amount, for a plurality of conveyance routes;
  determine a conveyance device to be assigned to an intersecting position where the conveyance routes intersect, based on whether or not a new conveyance route including the improvement target place intersects the intersecting position;
  determine, based on a flow rate of one of the conveyance routes being smaller than a threshold value at the intersecting position, whether or not there is a detour for the one of the conveyance routes, and
  control the conveyance device to operate as a unidirectional conveyor at the intersecting position and set the detour to the new conveyance route when there is the detour for the one of the conveyance routes, and control the conveyan ce device to operate as an omnidirectional conveyor at the intersecting position when there is no detour for the one of the conveyance routes.

2. The conveyance route design device according to claim 1, wherein the processor assigns an omnidirectional conveyor to the intersecting position when the new conveyance route and the one of the conveyance routes of the conveyance routes satisfy the criterion at the intersecting position.

3. The conveyance route design device according to claim 1,
wherein the processor determines at least a part of the new conveyance route including the improvement target place as an improvement candidate route based on at least one of information relating to the conveyance route and information relating to conveyance of objects,
wherein the processor generates device assignment information which assigns an omnidirectional conveyor or a unidirectional conveyor to the intersecting position, and
wherein the processor is further configured to generate a combination of at least a part of the improvement candidate route to which the conveyance device is assigned, as an improvement plan, based on the device assignment information.

4. The conveyance route design device according to claim 3, the processor is further configured to:
evaluate each improvement plan based on the conveyance vehicle information and outputs evaluation result;
determine an improvement plan giving best evaluation result as the best improvement plan based on the evaluation result; and
present the best improvement plan.

5. The conveyance route design device according to claim 4,
wherein the processor calculates evaluation index and required cost by predetermined formulas as the evaluation result for each improvement plan, and
wherein the processor determines, among the improvement plans for which the required cost is equal to or less than an allowable cost, an improvement plan for which the evaluation index is maximum as the best improvement plan.

6. The conveyance route design device according to claim 1, wherein the processor determines the improvement target place based on at least one of an average value of a residence time of objects, an average value of a conveyance time of objects, a number or a percentage of times that the residence time or the conveyance time exceeds an allowable value, and a value obtained by adding the average value of the residence time, the average value of the conveyance time and the number or the percentage with weights.

7. The conveyance route design device according to claim 3, wherein, when a residence time of objects immediately before a certain location on the conveyance route is equal to or greater than a predetermined threshold value and a conveyance time at the location is equal to or greater than a predetermined threshold value, the processor determines the location as an improvement target place and determines at least a part of the conveyance route including the improvement target place as the improvement candidate route.

8. The conveyance route design device according to claim 1, wherein the processor calculates an intersection area where the new conveyance route intersects an area occupied by a conveyance vehicle at the time of conveyance of objects on a conveyance route intersecting the new candidate route, and assigns the conveyance device to the intersection area.

9. The conveyance route design device according to claim 8, wherein, when flow rates of the objects in the new conveyance route and the one of the conveyance routes forming the intersection area are both equal to or greater than the threshold value, the processor controls the conveyance device to operate as the omnidirectional conveyor at the intersection area, and controls the conveyance device to operate as the unidirectional conveyor at the intersection area other than the intersection area to which the omnidirectional conveyor operation is assigned.

10. The conveyance route design device according to claim 8, wherein the processor:
determines a conveyance direction of the new conveyance route forming the intersection area as an improvement direction,
determines a conveyance direction of the one of the conveyance routes whose flow rate of the objects is equal to or greater than the threshold value as the improvement direction among the conveyance routes other than the new conveyance routes forming the intersection area, and
controls the conveyance device to operate as the omnidirectional conveyer at the intersection area when there are plural improvement directions at the intersection area, and controls the conveyance device to operate as the omnidirectional conveyer at the intersection area when there is one improvement direction at the intersection area.

11. The conveyance route design device according to claim 1,
wherein the information relating to the conveyance route includes layout information indicating positions of obstacles, and the conveyance route information indicating the route by which the objects are to be conveyed, and wherein the information relating to the conveyance of the objects includes conveyance request history information indicating a history of the conveyance request of the objects, and movement history information indicating an actual movement history of the objects.

12. A conveyance route design method executed by a computer, the method comprising:

determining an improvement target place that satisfies criteria for improving an actual conveyance amount with respect to a conveyance request amount, for a plurality of conveyance routes;

determining a conveyance device to be assigned to an intersecting position where the conveyance routes intersect, based on whether or not a new conveyance route including the improvement target place intersects the intersecting position;

determining, based on a flow rate of one of the conveyance routes being smaller than a threshold value at the intersecting position, whether or not there is a detour for the one of the conveyance routes, and controlling the conveyance device to operate as a unidirectional conveyor at the intersecting position and set the detour to the new conveyance route when there is the detour for the one of the conveyance routes, and controlling the conveyance device to operate as an omnidirectional conveyor at the intersecting position when there is no detour for the one of the conveyance routes.

13. A non-transitory computer-readable recording medium recording a conveyance route design program that causes a computer to:

determine an improvement target place that satisfies a criterion for improving an actual conveyance amount with respect to a conveyance request amount, for a plurality of conveyance routes; and determine a conveyance device to be assigned to an intersecting position where the conveyance routes intersect, based on whether or not a new conveyance route including the improvement target place intersects the intersecting position;

determine, based on a flow rate of one of the conveyance routes being smaller than a threshold value at the intersecting position, whether or not there is a detour for the one of the conveyance routes, and control the conveyance device to operate as a unidirectional conveyor at the intersecting position and set the detour to the new conveyance route when there is the detour for the one of the conveyance routes, and control the conveyance device to operate as an omnidirectional conveyor at the intersecting position when there is no detour for the one of the conveyance routes.

\* \* \* \* \*